United States Patent [19]

Lilley

[11] Patent Number: 4,608,604
[45] Date of Patent: Aug. 26, 1986

[54] CIRCUIT FOR REDUCING AFC OFFSET ERROR

[75] Inventor: Martin A. Lilley, Fremont, Calif.

[73] Assignee: Ampex Corporation, Redwood City, Calif.

[21] Appl. No.: 483,325

[22] Filed: Apr. 8, 1983

[51] Int. Cl.⁴ .......................... H04N 5/21; H04N 5/44
[52] U.S. Cl. .................................... 358/188; 358/158; 358/195.1
[58] Field of Search ..................... 358/158, 188, 195.1, 358/23, 25

[56]  References Cited

U.S. PATENT DOCUMENTS 3,518,362  6/1970  Fessard ............................. 358/188
4,091,421  5/1978  Long ................................. 358/195.1
4,500,922  2/1985  Van Roessel ..................... 358/188

Primary Examiner—Tommy P. Chin
Attorney, Agent, or Firm—George B. Almeida; Joel D. Talcott

[57]  ABSTRACT

A switched RF signal, formed of modulated RF and blanking level signals, is selectively phase inverted on alternate pairs of television lines to provide, after FM detection, a video signal containing alternating positive and negative offset errors. The video signal is integrated to average and thus, in effect, minimize the alternating errors.

14 Claims, 3 Drawing Figures

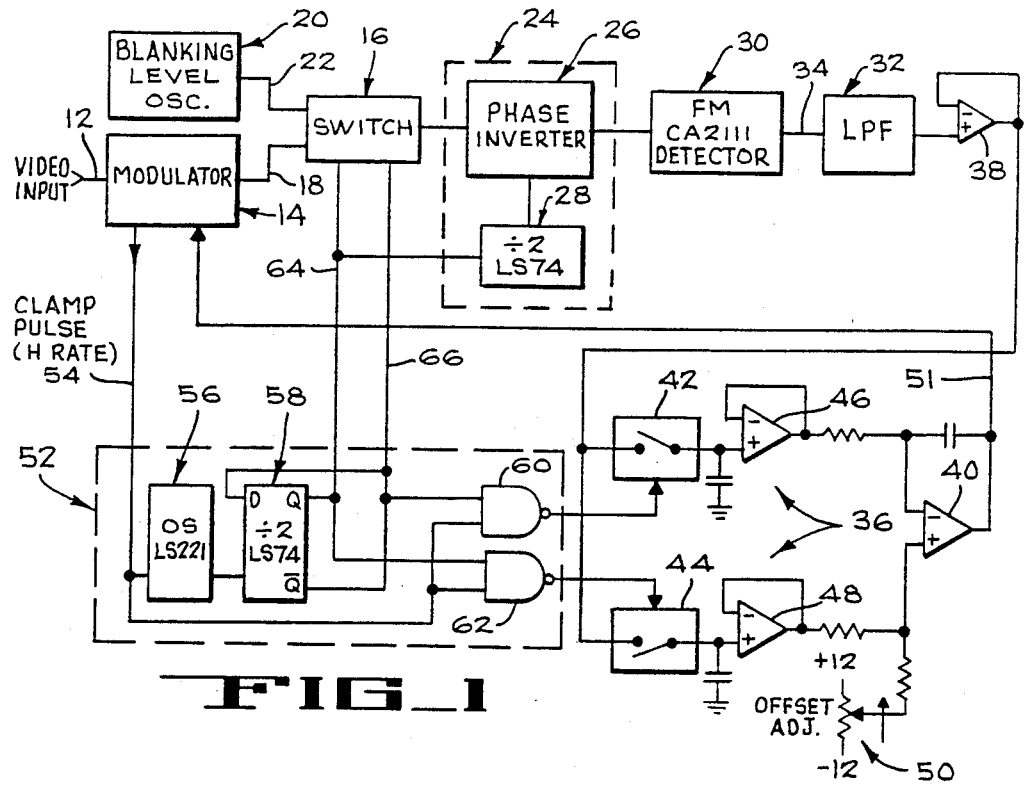
FIG_1
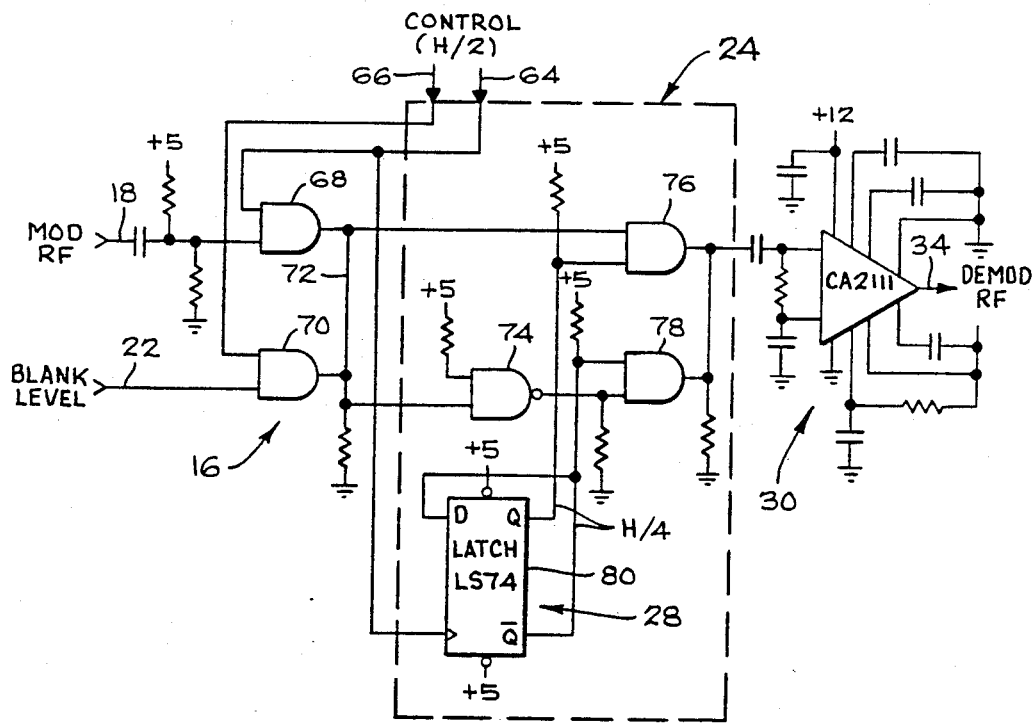
FIG_2

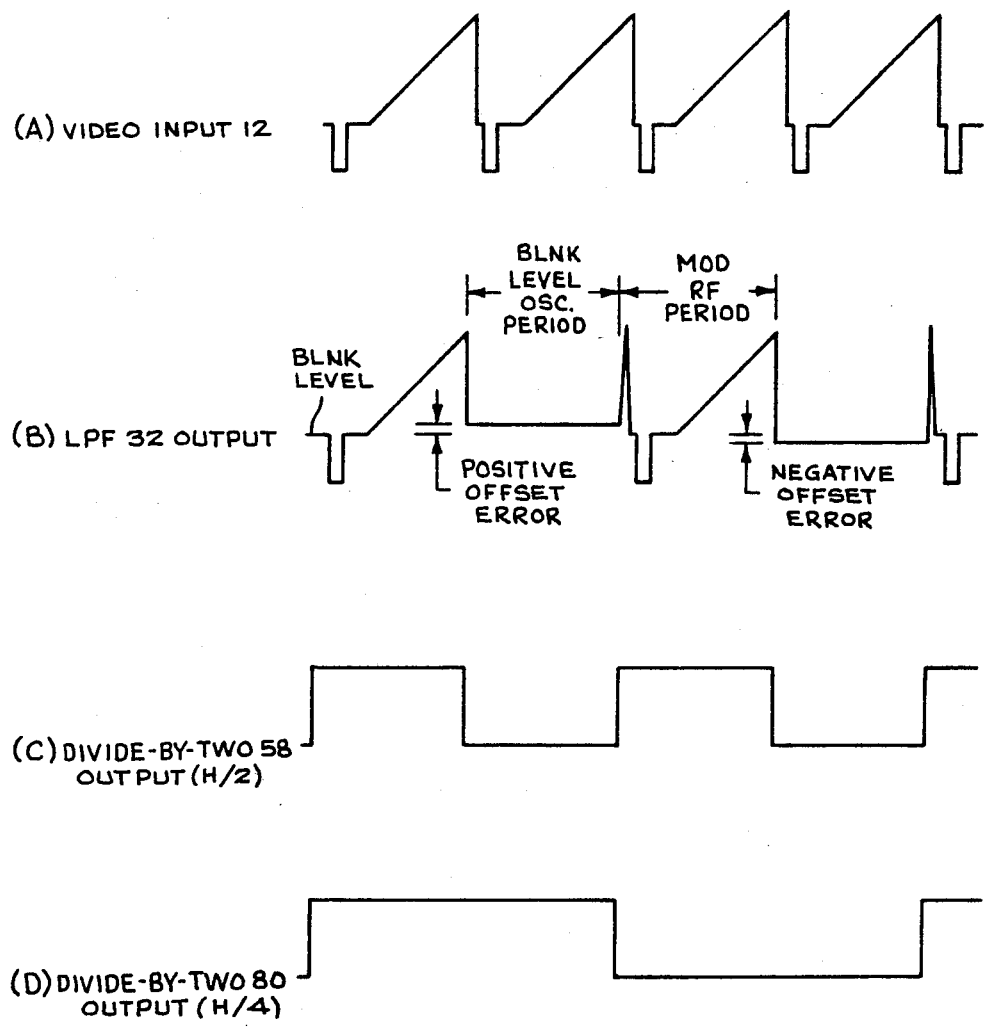
FIG_3

CIRCUIT FOR REDUCING AFC OFFSET ERROR

The invention relates to offset error reduction, and particularly to a circuit for minimizing the offset error introduced by an FM detector in a crystal AFC loop.

In a blanking level crystal automatic frequency control (AFC) system such as used in a videotape recorder FM system, an FM detector integrated circuit (IC) is used to detect frequency differences between a reference blanking level signal and the video modulated RF signal. These integrated circuits use quadrature detectors which may introduce an offset error if the switched crystal oscillator signal and the modulator RF signal fed thereto have an unequal mark/space ratio. Furthermore, the offset varies with respect to different FM detector integrated circuits. By way of explanation, the mark/space ratio is associated with squarewave signals and corresponds to the generation of a second harmonic which has a timing difference between the positive and negative half cycles of the squarewave. Thus mark/space ratio basically represents a measure of the second harmonic in the RF signal, wherein for minimum second harmonic component in the RF signal the mark/space ratio is ideally unity. It has been found, that a preferred consumer FM detector IC, with the added advantageous features of a built-in limiter in the quadrature detector, unfortunately is very sensitive to the mark/space ratio, and will produce an output error for signals of the same frequency but slightly different mark/space ratio.

In addition, offset errors also are generated by temperature variations which lead to instabilities in the circuit operation. The effects of temperature may be seen when a videotape recorder system first is turned on, and large offset errors which initially are present disappear after several minutes, whereupon the offset stabilizes. Such unstable operation is not acceptable in a videotape recorder system, where the advantage inherent in an AFC circuit are lost if the circuit is unstable immediately upon switching on the system.

Various schemes have been attempted by those in the art to circumvent the problems caused by offset errors and their negative effects on the blanking level. Predominant among these schemes is the concept of employing a blanking level oscillator and FM modulator with twice the usual operating frequency, and then dividing the frequency of the combined signal by two prior to FM detection to insure a unity mark/space ratio signal. Although such a scheme is successful in solving the problem of excessive and unstable offset error caused by a second harmonic component at the FM detector input, it causes other problems related to the higher frequencies utilized, which manifest themselves throughout the circuit in the form of unacceptable crosstalk.

Another scheme employs the use of an FM detector which inherently is not succeptable to the second harmonic problem, and thus is relatively immune to offset error. However, the sensitivity of the detector is extremely low, which leads to an unacceptable signal-to-noise ratio on the detected video signal which adversely affects the AFC performance.

A further scheme wherein the input of the detector IC is tuned to remove the second harmonic component, is partially successful. However, such a scheme has the disadvantage of requiring a further adjustment, and the adjustment which is required also affects the offset error. Thus, although the second harmonic is removed by the adjustment, it also causes a shifting in the offset which, in effect, compounds the offset error problem.

More particularly, in an AFC system, if an unstable second harmonic component exists in the signal generated by switching between the modulator RF signal and the blanking level oscillator signal, the blanking level frequency from the modulator will drift. This causes an error voltage in the AFC feedback loop indicative of a modulator frequency error, wherein instead, the error voltage itself would be in error. Still, the AFC loop would react to the erroneous voltage, causing the FM modulator to change its output frequency when in fact it should not.

Accordingly, it is an object of the invention to make the offset error in an AFC circuit independent of the associated FM detector IC.

It is another object to minimize the offset error introduced by an FM detector by selectively inverting the phase of the switched RF signal prior to the detection thereof to allow subsequent cancellation of the error.

Another object is to reduce the effects of second harmonic distortion in a switched blanking level/modulator RF signal by inverting the phase of the RF signal and then, after detection, integrating the resulting alternating offset errors to cancel them.

Still another object is to reduce the offset error by reversing the polarity while retaining the amplitude thereof, and then averaging out the error.

Yet another object is to provide an AFC circuit which is insensitive to second harmonic distortion, temperature changes, and variations in the characteristics of different FM detector IC's.

A further object is to reduce offset error by phase inverting a switched RF signal on alternate pairs of television lines, prior to the FM detector.

These objects and others are accomplished by the invention while overcoming the disadvantages of the above-mentioned prior art, by inverting the phase of the conventionally switched modulated RF signal, immediately prior to performing the FM detection process, after each sampling of the AFC error. This causes the offset error in the demodulated video to reverse polarity while retaining the same amplitude. Inversion of the RF signal is performed on alternate pairs of television lines, at the corresponding switching rate. Sample and hold circuits and a differential amplifier following the FM detector, integrate the alternating offset errors, to minimize the offset error in the AFC loop error signal.

BRIEF DESCRIPTION OF THE DRAWINGS

FIG. 1 is a block diagram illustrating the configuration of the invention within an autommatic frequency control system.

FIG. 2 is a schematic diagram of one embodiment of the invention combination.

FIG. 3 is a graph depicting waveforms generated at various points in the circuit of FIGS. 1, 2.

DETAILED DESCRIPTION

Referring to FIG. 1, a video signal is supplied to an input 12 of an FM modulator 14, which supplies a modulated RF signal to two-by-one switch means 16 via a line 18. Blanking level oscillator means 20, corresponding to a conventional reference black level generator, supplies a blanking level signal corresponding to video blanking level frequency, to the switch means 16 via a line 22. Switch means 16 supplies a switched RF signal to phase inverting means 24, which includes a phase inverter 26 and a divide-by-two (÷2) latch 28 coupled to the inverter 26. The output of phase inverting means 24 is coupled to FM detector means 30, and thence to a low pass filter 32 via a line 34. The filter is coupled to sample/hold (S/H) means 36 via a buffer stage 38, which provides a low impedance input to the sample/hold means. The sample/hold means 36 are coupled to a differential amplifier/integrator 40, and thence back to the FM modulator means 14 as the automatic frequency control error signal thereto.

The sample/hold means 36 includes a pair of S/H circuits 42, 44 and respective associated differential amplifiers 46, 48, in first and second signal paths, respectively. The outputs of amplifiers 46, 48 are supplied to the negative and positive inputs respectively, of the differential amplifier 40. An offset adjust means 50, formed by an adjustable potentiometer, is coupled to the positive input of the amplifier 40, and provides partial adjustment for offset errors.

A control means 52 provides timing pulses to the various circuit components in response to a conventional horizontal line rate (H-rate) clamp pulse on a line 54 from the modulator video input clamp. H-rate for the clamp pulse in an NTSC, 525 line, video system is 15.750 kiloHertz (kHz), as employed herein by way of example only. The clamp pulse is used to clamp the video input signal prior to modulation in the FM modulator means 14. Control means 52 includes a one-shot multivibrator 56 coupled to the clamp pulse line 54, and thence to the clock input of a divide-by-two (÷2) latch 58. By way of example only, the one-shot 56 has a delay of 50 microseconds (us) and the divide-by-two latch 58 is a D-type flip-flop.

The true and not-true outputs of latch 58 are coupled to first inputs of a pair of NAND gates 62 and 60 respectively, and the clamp pulse line 54 is coupled to the second inputs thereof. The outputs of the NAND gates 60, 62 supply alternate timing pulses to the control inputs of the S/H circuits 42, 44 respectively. The not-true output of the latch 58 is coupled to switch means 16 via a line 66, and the true output is coupled via line 64 to the switch means 16 as well as to the ÷2 latch 28, to synchronize operation thereof.

In operation, the modulator RF signal on line 18, and the blanking level signal on line 22 (7.9 megaHertz), are alternately switched to the input of the phase inverter 26 by the switch means 16, at one-half the clamp pulse rate, i.e, H/2=7.8 kHz. The switching is controlled via the ÷2 latch and lines 64, 66. In accordance with the invention, the phase of the switched RF signal is inverted by the phase inverter 26, in response to the ÷2 latch 28, at a H/4 rate, ie. 3.9 KHz. The inversion thus is performed on alternate pairs of television lines, as further described in FIGS. 2 and 3. The inverted signal includes any mark/space ratio error, whereby the polarity of the mark/space ratio error is reversed while retaining the same amplitude. The switched inverted/non-inverted signal is frequency demodulated via the FM detector means 30 to provide a video signal containing information representing the difference between the blanking level and the modulator RF signals, and is filtered and supplied to the sample/hold means 36. The S/H circuits 42, 44 are switched via the NAND gates 60, 62 at a H/2 (7.8 kHz) rate, resulting in S/H circuit 42 storing the blanking level oscillator detected D.C. level and the S/H circuit 44 storing the modulator blanking level detected DC level. Differential amplifier/integrator 40 provides a DC signal whose amplitude is the AFC error signal with minimal offset errors. The DC signal is fed back to the FM modulator means 14 via the output line 51 to correct the modulating frequency.

Referring to FIG. 2, an implementation of the phase inverting means 24 is depicted, wherein similar components are similarly numbered. Thus, the modulator RF signal on line 18 is AC coupled to a first AND gate 68 of the two-by-one switch means 16, and the blanking level signal on line 22 is coupled to a second AND gate 70. The gates 68, 70 are switched at the H/2 rate via lines 64, 66 to alternately place the modulator RF signal or the blanking level signal onto a common input 72 of the phase inverter 26.

Phase inverter 26 includes an inverting AND gate 74 coupled to the input 72 at one input. The input line 72, and the output of inverting AND gate 74, are coupled respectively to first inputs of a pair of switching AND gates 76, 78. A D-type flip-flop 80 corresponding to the divide-by-two latch 28 of FIG. 1, is clocked by the timing signal on line 64 and, in turn, provides timing signals via its true and not-true outputs, to the second inputs of the AND gates 76 and 78 respectively, at the H/4 rate. The outputs of AND gates 76, 78 are AC coupled via a common line to the FM detector means 30, herein depicted by way of example only, as a CA2111 manufactured by RCA. The detector means 30 supplies the demodulated RF signal, which now is alternating lines of video and blanking level, with the alternating offset errors, to the filter 32 via the line 34. The video signal thus detected with alternating offset errors is then fed to the sample/hold means 36 to cancel the errors, as previously described.

FIG. 3 depicts by way of example, the waveforms generated at various points in the circuit of FIGS. 1 and 2. Thus, FIG. 3A depicts the video input signal supplied at input 12. FIG. 3C depicts the H/2 rate timing signals supplied to the switch means 16 from the ÷2 latch 58 via lines 64, 66. FIG. 3B depicts the signal generated at the output of the low pass filter 32, which has been demodulated by the FM detector 30 and filtered, and which depicts the alternating positive and negative offset errors which are subsequently cancelled by the integration process. FIG. 3D depicts the timing signals from the ÷2 latch 80 at the H/4 rate, which control the operation of the AND gates 76, 78.

What is claimed is:

1. A circuit for reducing offset errors in a modulated RF signal detected by FM detector means, comprising:
   means for supplying a blanking level signal;
   switching means for combining the blanking level and the modulated RF signals to define a switched RF signal;
   means coupled to the switching means for selectively inverting the phase of the switched RF signal at a selected rate; and
   means for integrating the subsequent detected signal from the FM detector means at a second selected rate to define an output signal with minimal offset errors.

2. The circuit of claim 1 including:
   control means for supplying timing pulses related to H line rate; and
   said inverting means being responsive to the control means timing pulses.

3. The circuit of claim 2 wherein the inverting means includes:

an inverter for phase inverting selected intervals of the switched RF signal; and gating means coupled to the inverter for supplying alternate inverted and non-inverted intervals of the switched RF signal to the FM detector means in response to the control means.

4. The circuit of claim 3 wherein the inverting means further includes:

latch means responsive to the control means for switching the gating means at H/4 line rate.

5. The circuit of claim 3 wherein the integrating means includes:

sample/hold means operatively coupled to the FM detector means for holding successive inverted and non-inverted interval signals; and an integrating circuit coupled to the sample/hold means for summing the successive inverted and non-inverted interval signals to define an output signal with minimal offset errors.

6. The circuit of claim 5 wherein the sample/hold means is responsive to the control means at an H/2 rate.

7. A circuit for reducing offset errors in a switched signal, comprising:

means for inverting the phase of the switched signal at a selected rate and to provide therefrom a video signal containing intervals of alternating positive and negative offset errors; and means for integrating the video signal to average the alternating offset errors to define an output signal with minimal offset errors.

8. The circuit of claim 7 wherein the means for inverting include:

a phase inverter; and control means coupled to the phase inverter for supplying thereto timing pulses at the selected rate.

9. The circuit of claim 8 including:

means for providing a horizontal line related timing signal; and said control means being responsive to the providing means for supplying the timing pulses to the phase inverter on alternate pairs of horizontal lines.

10. The circuit of claim 8 wherein the means for integrating includes:

first sample/hold means for storing the positive offset error interval of said video signal;

second sample/hold means for storing the negative offset error interval of the video signal; and integrator means coupled to the first and second sample/hold means for summing the stored intervals of the video signal to minimize the alternating positive and negative offset errors.

11. A circuit for reducing offset errors caused by FM detector means, resulting from second harmonic distortion in a modulated RF signal, comprising:

means for supplying a blanking level signal;

means for providing timing signals at a horizontal line related rate;

inverting means disposed to receive both the modulated RF signal and the blanking level signal for inverting the phase of the combined modulated RF and blanking level signals in response to the timing signals to provide a detected video signal with alternating positive and negative offset errors; and means for integrating the detected video signal to average the errors to define an output signal with minimal offset errors.

12. The circuit of claim 11 including:

control means responsive to the means for providing timing signals for supplying timing pulses to the means for integrating at one-half horizontal line related rate, and to the inverting means at one-quarter horizontal line related rate.

13. The circuit of claim 12 wherein the inverting means includes:

an inverter for phase inverting the combined modulated RF and blanking level signal prior to the FM detector means in response to the one-quarter horizontal line related rate.

14. The circuit for claim 13 wherein the integrating means includes:

sample/hold means operatively coupled to the FM detector means for holding successive signal values containing the alternating positive and negative offset errors; and amplifier/integrator means coupled to the sample/hold means for summing the successive signal values of alternating offset errors to average the errors.

* * * * *